(12) United States Patent
Matsumura et al.

(10) Patent No.: US 6,931,650 B2
(45) Date of Patent: Aug. 16, 2005

(54) PICKUP DEVICE AND DISK DRIVE

(75) Inventors: Kazuyuki Matsumura, Kumamoto (JP); Munenori Aoyagi, Kumamoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 164 days.

(21) Appl. No.: 10/320,984

(22) Filed: Dec. 17, 2002

(65) Prior Publication Data

US 2003/0123374 A1 Jul. 3, 2003

(30) Foreign Application Priority Data

Dec. 27, 2001 (JP) ........................................ 2001-396415

(51) Int. Cl.$^7$ ............................................... G11B 7/00
(52) U.S. Cl. ...................................................... 720/685
(58) Field of Search ....................... 360/245.9; 369/219, 369/244, 44.14, 44.15, 215

(56) References Cited

U.S. PATENT DOCUMENTS 5,539,767 A * 7/1996 Nakanishi et al. .......... 372/109
6,625,091 B2 * 9/2003 Obara ..................... 369/44.14

FOREIGN PATENT DOCUMENTS

| JP | 08288693 | * | 1/1996 | ............ G11B/7/22 |
| JP | 09115164 | * | 5/1997 | ............ G11B/7/22 |
| JP | 10-92005 |   | 4/1998 |                      |

* cited by examiner

Primary Examiner—A. J. Heinz
Assistant Examiner—Mark Blouin
(74) Attorney, Agent, or Firm—RatnerPrestia

(57) ABSTRACT

A pickup device employing an inexpensive flexible printed circuit sheet (FPC) which demonstrates preferable electrical characteristics. FPC has a signal conductive layer inside, and a U-shape bending portion is formed in a midway of FPC at a position where a hologram unit is connected. An opening is formed on FPC adjacent to an area when the hologram unit is connected, and the length of this opening is longer than the height of the hologram unit.

10 Claims, 11 Drawing Sheets

US 6,931,650 B2

PICKUP DEVICE AND DISK DRIVE

FIELD OF THE INVENTION

The present invention relates to disk drives for reproducing information from disk media or recording information onto disk media, and more particularly to pickup devices employing a hologram unit.

BACKGROUND OF THE INVENTION

Mobile personal computers are continuing to be thinner, smaller, and lighter. However, the memory capacity required by these mobile personal computers is expanding rapidly, necessitating the use of large-capacity external storage device. Optical recording media such as CD-R/RWs and DVDs are used as external memory for mobile personal computers since they feature large capacity and are easy to operate.

Accordingly, disk drives are widely used as external storage devices. A conventional disk drive is described next with reference to drawings. FIG. 8 is a perspective of a conventional disk drive, and FIG. 9 is a perspective of a pickup module in FIG. 8. FIG. 10 is a perspective of a pickup in FIG. 9, and FIG. 11 is a structural sectional view of a flexible printed circuit sheet (FPC) used in FIG. 10.

As shown in FIG. 8, the disk drive is configured by assembling pickup module 111 (hereafter referred to as PUM) onto tray 112, and covering this tray 112 with housing 113. Pickup module 111, as shown in FIG. 9, is made by assembling spindle motor 115 and pickup 116 on base 114.

Pickup 116, as shown in FIG. 10, has an optical element consisting of carriage unit 123, actuator 125, and object lens 126; FPC unit 122; and hologram unit 127. Actuator 125 supports object lens 126 such that object lens 126 can be slightly displaced in the focus direction and tracking direction during driving. Actuator FPC 8 supplies power for driving actuator 125 that effects this displacement.

Hologram unit 127 has a built-in laser beam source, and emits and converges the laser beam on an optical recording medium through object lens 126. Hologram unit 127 also has a built-in photodetector to detect reflected light from the optical recording medium to reproduce information in the optical recording medium as a signal. FPC unit 122 supplies power to hologram unit 127, and transmits reproducing signals. FPC unit 122 is provided with adjustment slack 132 (where bent through 90°) at the connecting point of FPC unit 122 and hologram unit 127 for adjusting hologram unit 127 by rotating it.

FIG. 11 is a sectional view taken along Line X—X in FIG. 10. FPC unit 122 has a two-layer structure to secure stable electrical characteristics by providing as broad a grounding area (GND) as possible in the electrical circuit configuration. A first layer (LY1) is configured with film 143 on its bottom, followed by adhesive 142, copper foil 141, adhesive 142, and film 143. A second layer (LY2) is configured with adhesive 142, copper foil 141, adhesive 142, and film 143 downward from the bottom face of the first layer in FIG. 11. The copper foil in the first layer and the copper foil in the second layer are connected via a conductive through-hole 148 (hereafter referred to as through-hole). The conventional FPC unit as configured above can only be produced by a limited number of manufacturers. In addition, the FPC unit is extremely expensive due to the need for considerable man-hours and high material costs.

Optical recording and reproducing devices (disk drives) are required to be ever slimmer, smaller, and lighter. In line with the recent sharp drop in OA equipment price, significant cost reductions are also demanded for optical recording and reproducing devices and their components. However, the conventional configuration prevents any significant reduction of FPC cost.

SUMMARY OF THE INVENTION

A pickup device of the present invention has a carriage movably supported along the radius of a recording medium; an optical element housed in the carriage; a hologram unit housed in the carriage and with a built-in laser beam source and photodetector; and a flexible printed circuit sheet (FPC) for supplying power to the hologram unit and transmitting reproducing signals. The hologram unit emits the laser beam and outputs the information signals in the optical recording medium. The FPC has a built-in single conductive layer, and has a rectangular opening surrounded by U-shape bending portions and a hologram connecting land. The width of the opening along the U-shape bending portion is greater than the height of the hologram unit, and the hologram unit is connected to the hologram connecting land by bending the U-shape portion into a U-shape.

The present invention has a single-layer FPC unit and shielding. An external form (GND pattern) is broadened to the extent that the number of FPC units in a sheet in production does not change. This makes it possible to offer a pickup device using an inexpensive FPC with preferable electrical characteristics.

DESCRIPTION OF THE PREFERRED EMBODIMENTS

Figure 1:
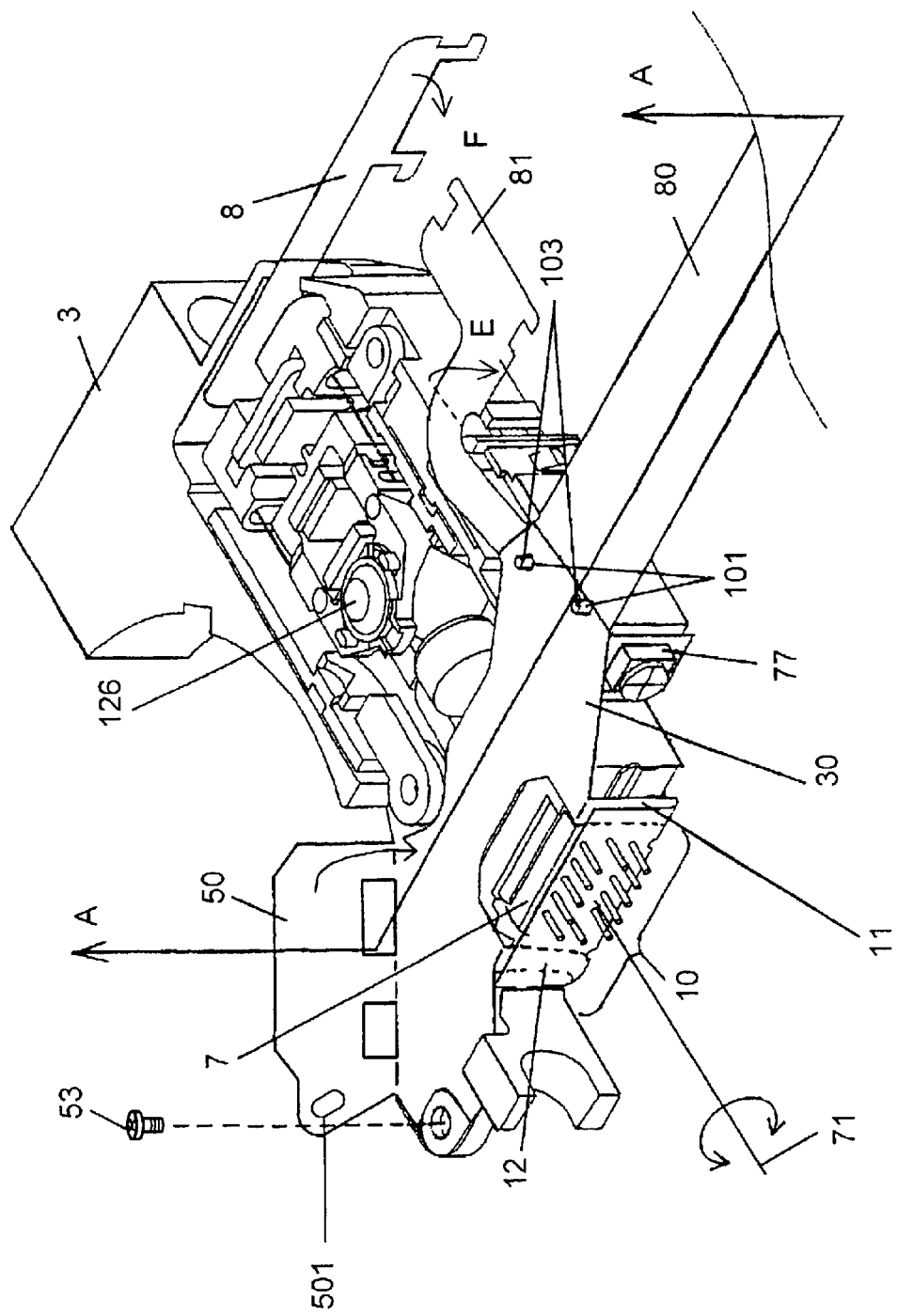
FIG. 1 is a perspective of a pickup in accordance with a preferred embodiment of the present invention.

A preferred embodiment of the present invention is described below with reference to drawings.

A disk drive and a pickup module (PUM) in a preferred embodiment of the present invention are similar in part to a conventional disk drive and pickup module, and thus the same reference numerals are used to avoid redundancy.

Figure 8:
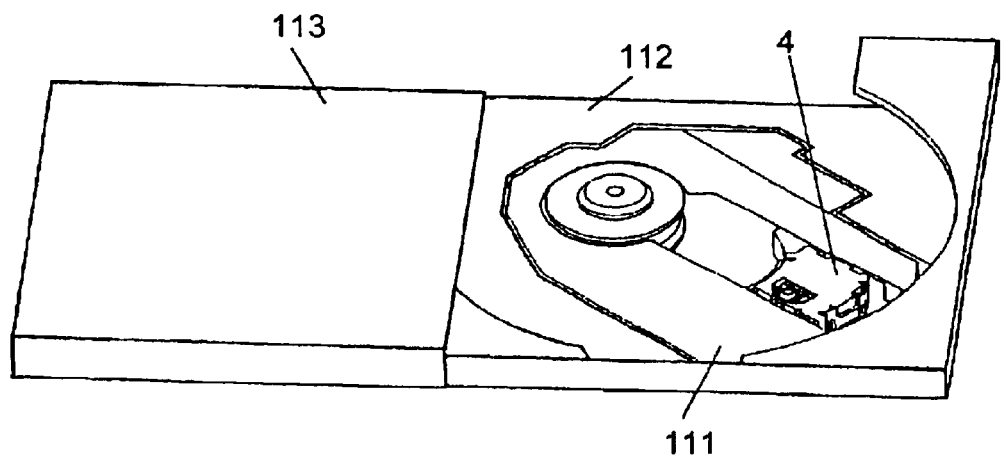
FIG. 8 is a perspective of a conventional disk drive.
Figure 9:
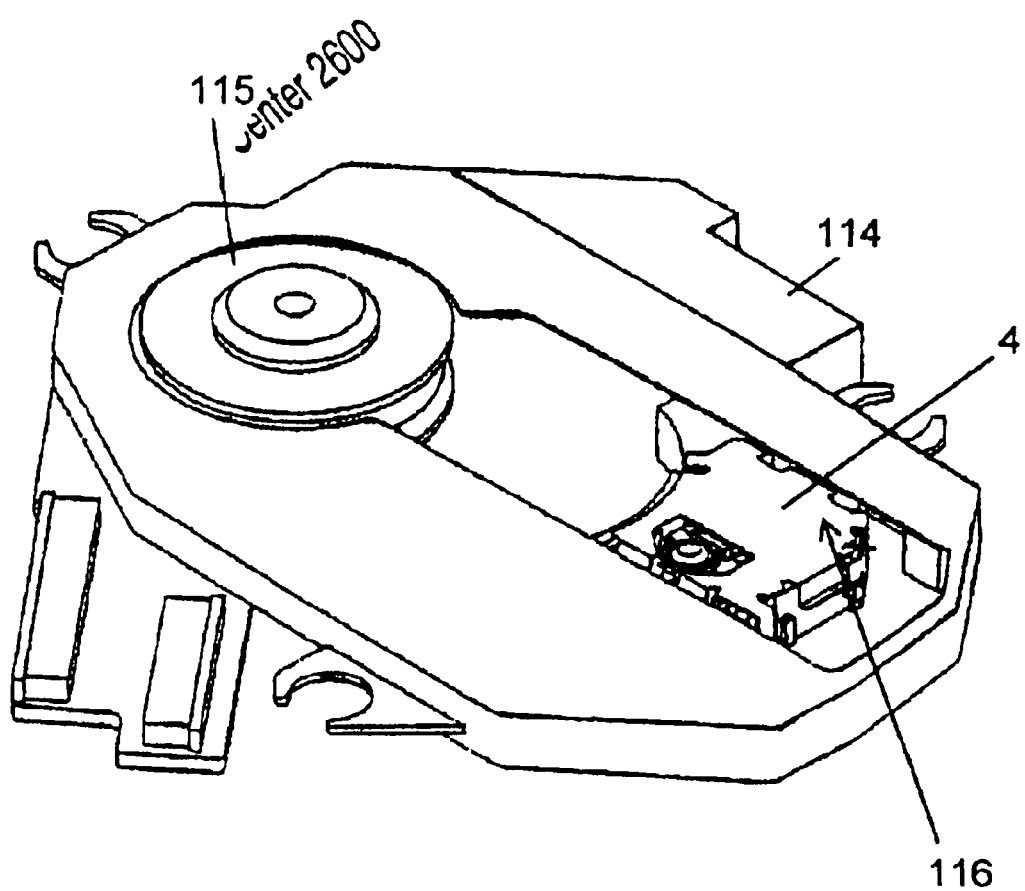
FIG. 9 is a perspective of a pickup module in FIG. 8
Figure 10:
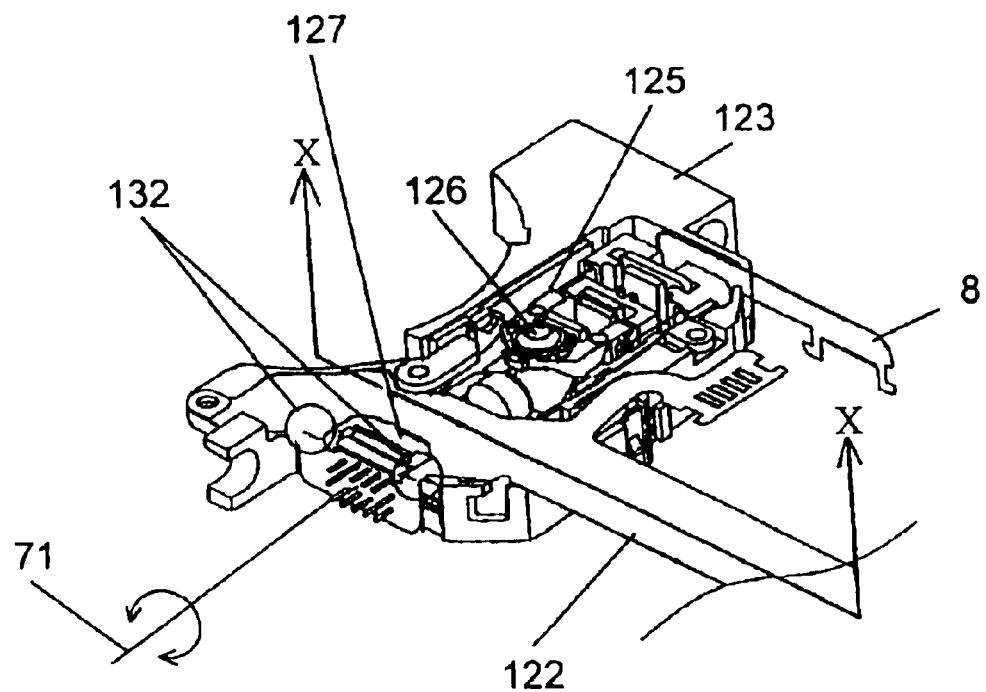
FIG. 10 is a perspective of the pickup in FIG. 9.
Figure 11:
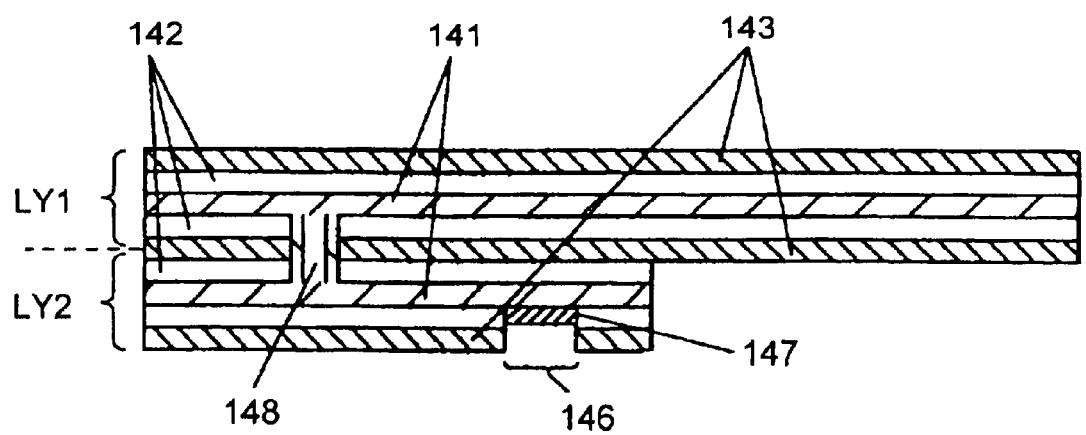
FIG. 11 is a structural sectional view of a FPC used in FIG. 10.

FIG. 1 is a perspective of the pickup in the preferred embodiment of the present invention. Pickup 1 has a structure in which flexible printed circuit sheet (FPC) unit 30 is assembled onto carriage unit 3, and cover 4 (see FIGS. 8 and 9) is placed on its top. Hologram unit 7 and other components are mounted on FPC unit 30 in advance as shown exploded in FIG. 3. FPC unit 30, after bending and cutting, is mounted on carriage unit 3. The operation of FPC unit 30 mounted on carriage unit 3 but before fixing is then tested using lenses. In this test, an adjustment jig is attached to hologram unit 7, and adjustment screwdriver is set to volume 77.

Hologram unit 7 is attached to rotation adjustment area 10 of carriage unit 3. The lead of the FPC for hologram unit 7 is first bent downward, and then bent upward again to create right adjustment slack 11 and left adjustment slack 12. In other words, right and left adjustment slacks 11 and 12 are bent in a U-shape. Even though hologram unit 7 is rotated and adjusted on rotation axis 71, the FPC unit 30 is not displaced because these slacks absorb the displacement by the rotation of hologram unit 7. More specifically, provision of these slacks prevents FPC unit 30 from rising from the top face of carriage unit 3 when adjusting the rotation of the hologram unit, assuring reliable adjustment. In addition, the reciprocating motion of carriage unit 3 along the radius of a disk medium is not interfered by FPC unit 30 rising from the top face.

Furthermore, FPC positioning hole 101 is provided at the position where FPC unit 30 (corresponding to main lead 80 in FIG. 3) protrudes from carriage unit 3. Positioning boss 103 is provided on carriage unit 3. Main lead 80 and lead 81 are provided outside of positioning hole 101. A protruding portion of main lead 80 which is drawn out from carriage unit 3 is retained by positioning boss 103 at positioning hole 101. The above configuration avoids twisting main lead 80 due to positional deviation of main lead 80 at a point protruding from carriage unit 3.

Figure 2:
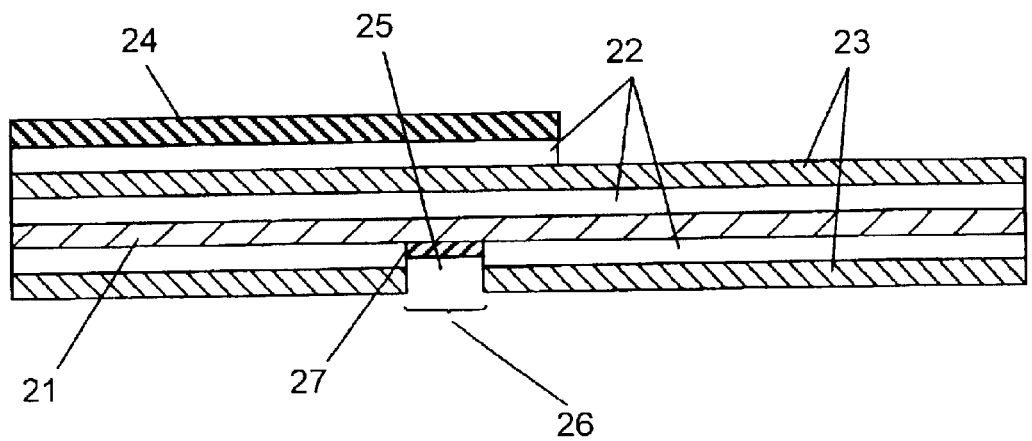
FIG. 2 is a block diagram of a FPC unit in FIG. 1.

FIG. 2 is a sectional view of FPC unit in FIG. 1 taken along Line A—A. Films 23 sandwich both faces of copper foil 21 using adhesive 22. Support plate 24 is attached to film 23 using adhesive. Film opening 26 is provided on film 23 at points where land 25 is needed, and copper foil 21 exposed in this opening 26 is soldered.

Figure 3:
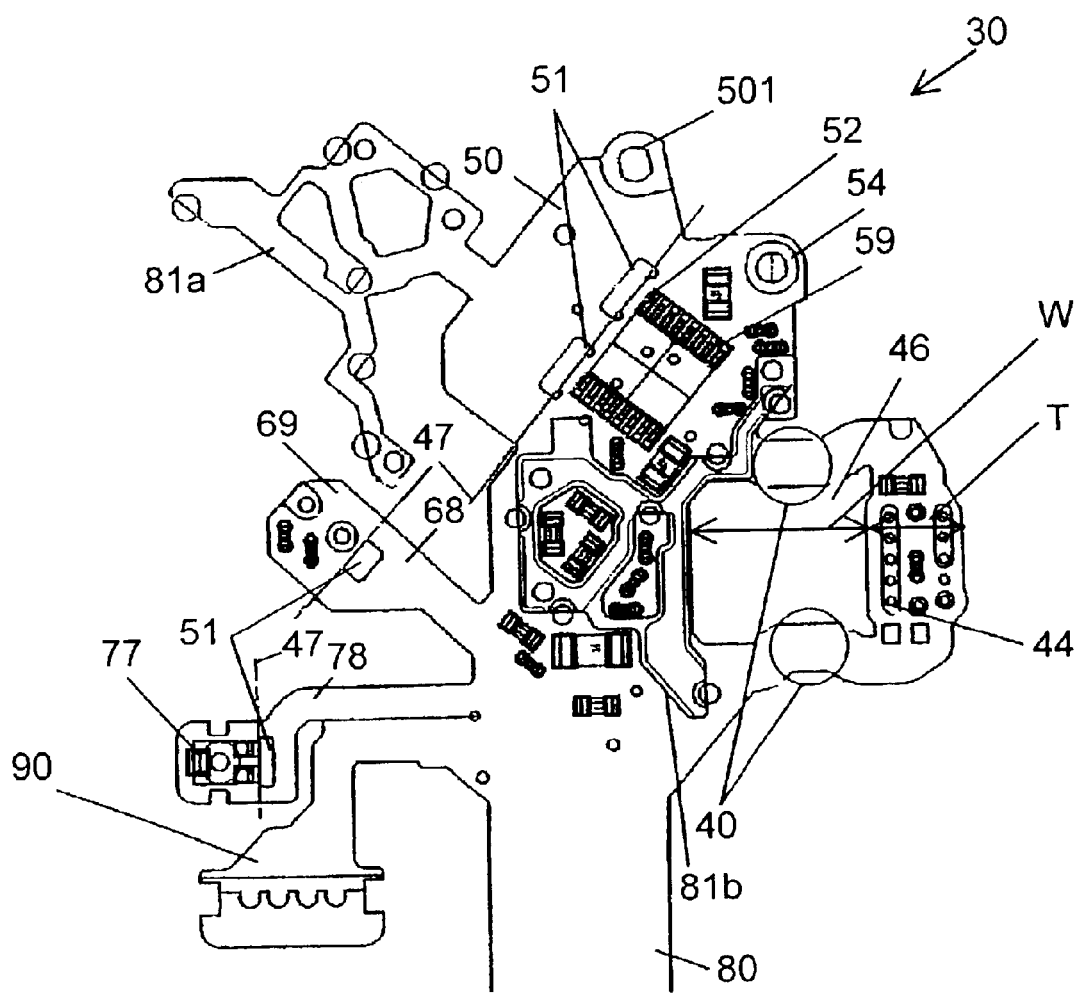
FIG. 3 is an exploded view of a key part of the FPC unit in FIG. 1.
Figure 6:
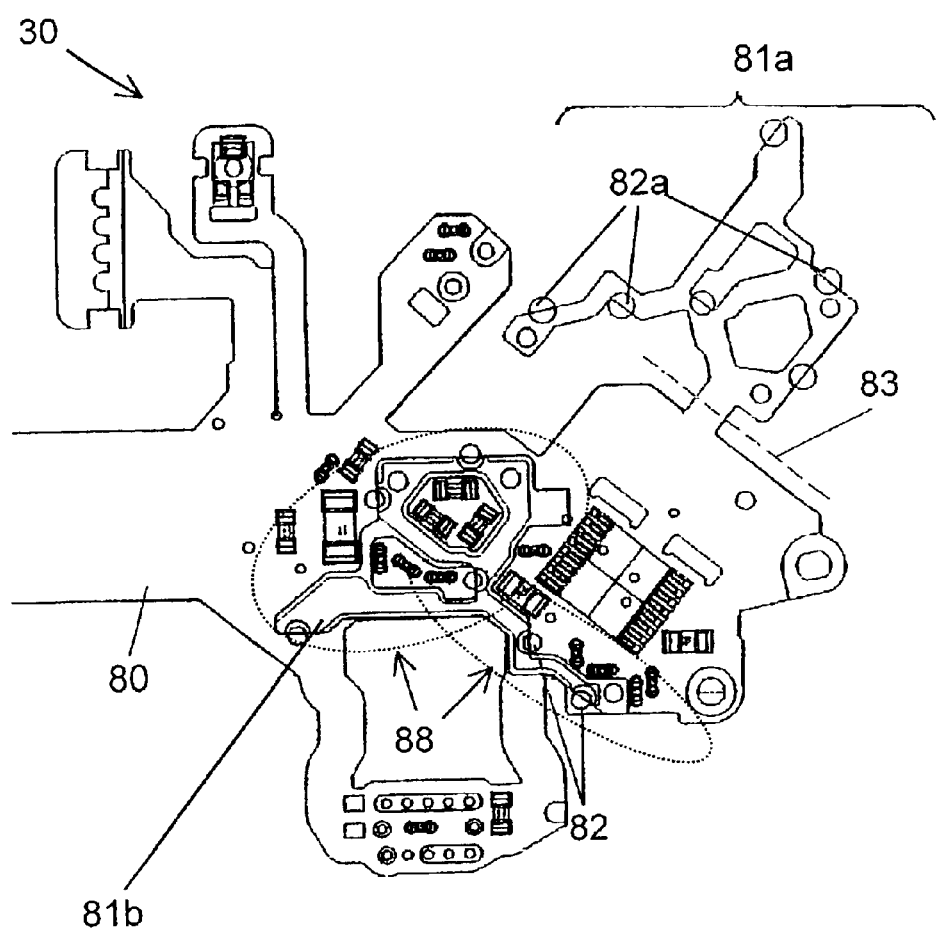
FIG. 6 is a magnified view of a key part in FIG. 3.

FIG. 3 is an exploded view of a key part of the FPC unit in FIG. 1. The FPC unit 30, hologram U-shape bending portion 40, and land (hereafter referred to as the hologram connecting land) 44 for connecting the hologram unit are indicated in FIG. 3. Hologram U-shape bending portion 40 creates right adjustment slack 11 and left adjustment slack 12 in FIG. 1. Opening 46 is an approximately rectangular space surrounded by component mounting land 88 (as shown in FIG. 6) of FPC unit 30, hologram U-shape bending portion 40, and hologram connecting land 44. Opening width W of opening 46 to the direction of hologram U-shaped bending portion 40 is wider than width T of hologram connecting land 44 corresponding to hologram unit 7 (equivalent to the height of hologram unit 7). In other words, two FPCs branched from main lead 80 with the opening in between are bridging to hologram connecting land 44. The bridging portions correspond to the hologram U-shape bending portion 40. Hologram 7 unit is connected to hologram connecting land 44 at a tip of a branch of main FPC80. This configuration allows the FPC length required for forming hologram U-shape bending portion 40 to be secured. Consequently, hologram unit 7 can be rotated for adjustment, and also hologram unit 7 can be attached to carriage unit 3 without slack or lifting from the top face of carriage unit 3 as described previously.

FIGS. 1 and 3 illustrate hologram U-shape bending portion 40 and opening 46 when one hologram unit 7 is mounted on carriage unit 3. However, the number of hologram units 7 to be mounted is not limited to one. For example, two hologram units with respective wavelength for CD and DVD are required for an optical disk apparatus for reproducing CD optical system and DVD optical system. In this case, hologram U-shape bending portion 40 and opening 46 are formed corresponding to the number of hologram units required to be mounted.

Figure 4:
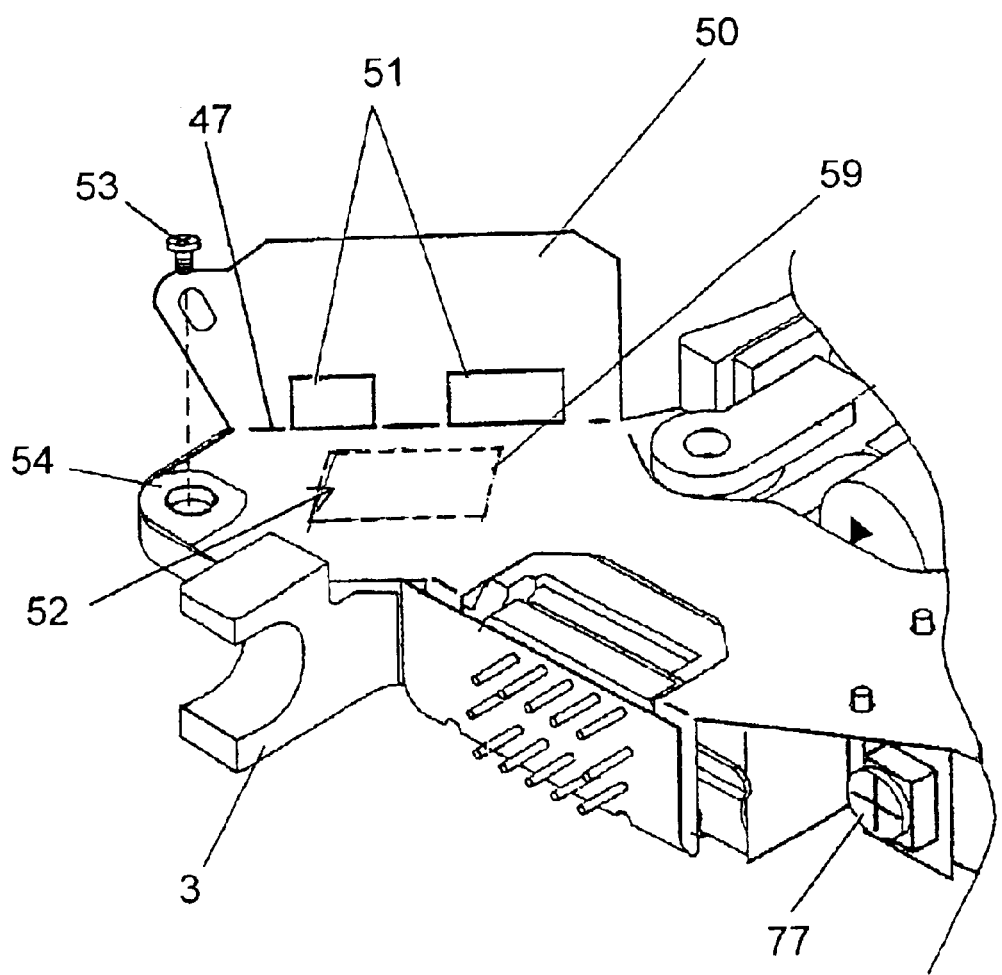
FIG. 4 is a perspective of an assembly of shielding in the FPC unit in FIG. 3.

FIG. 4 is a perspective of the assembly of shielding in the FPC unit in FIG. 3. Positions of FPC shielding pattern 50, bending hole 51, IC terminal 52, IC mounting land 59, screw 53, and grounding 54 are indicated. Entire FPC shielding pattern 50 is covered by copper foil 21 of a single-layer FPC to be used as a grounding pattern. Copper foil 21 is exposed on the film opening where a part of film 23 and adhesive 22 on the single-layer FPC are removed, and solder 27 is applied on copper foil 21 in the opening to create land 25. This land 25 is used as grounding 54. FPC shielding pattern 50 is bent toward carriage unit 3 such that screw hole 501 matches grounding 54. Grounding 54 is fixed onto carriage unit 3 by screw 53. Grounding can thus be provided from GND of FPC unit to carriage unit 3 at one point. In addition, this configuration assures reliable shielding effect because IC mounting land 59 is practically covered by double layer of FPC.

In other words, a shielding effect equivalent to that of a two-layer FPC is achievable. Since the amplifier for amplifying signals and the high-frequency superimposed circuit that drives the semiconductive laser used inside hologram unit 7 with high-frequency power are both mounted on IC mounting land 59, the shielding effect equivalent to that of the two-layer FPC achieves high operation reliability for stably operating the mounted amplifier and high-frequency overlapping circuit.

In particular, the entire body of FPC unit 30 is made of a single layer, and the outline (GND pattern) is extended to the extent that the number of FPC units 2 per sheet does not change in production. Then, shielding pattern 50 which is included in this extended portion is bent to overlay it on FPC unit 30. This achieves an FPC with performance equivalent to the conventional two-layer FPC at less than 50% of the cost of that of the prior art.

Bending hole 51 is a rectangular or elliptical hole, with its straight portion matched to bending line 47. In addition, bending hole 51 is created as close as possible to the soldering portion and connecting land terminals of mounting components. This configuration avoids applying stress directly to the soldered portion when the FPC is bent, preventing solder peeling as a result of bending of the FPC.

Figure 5:
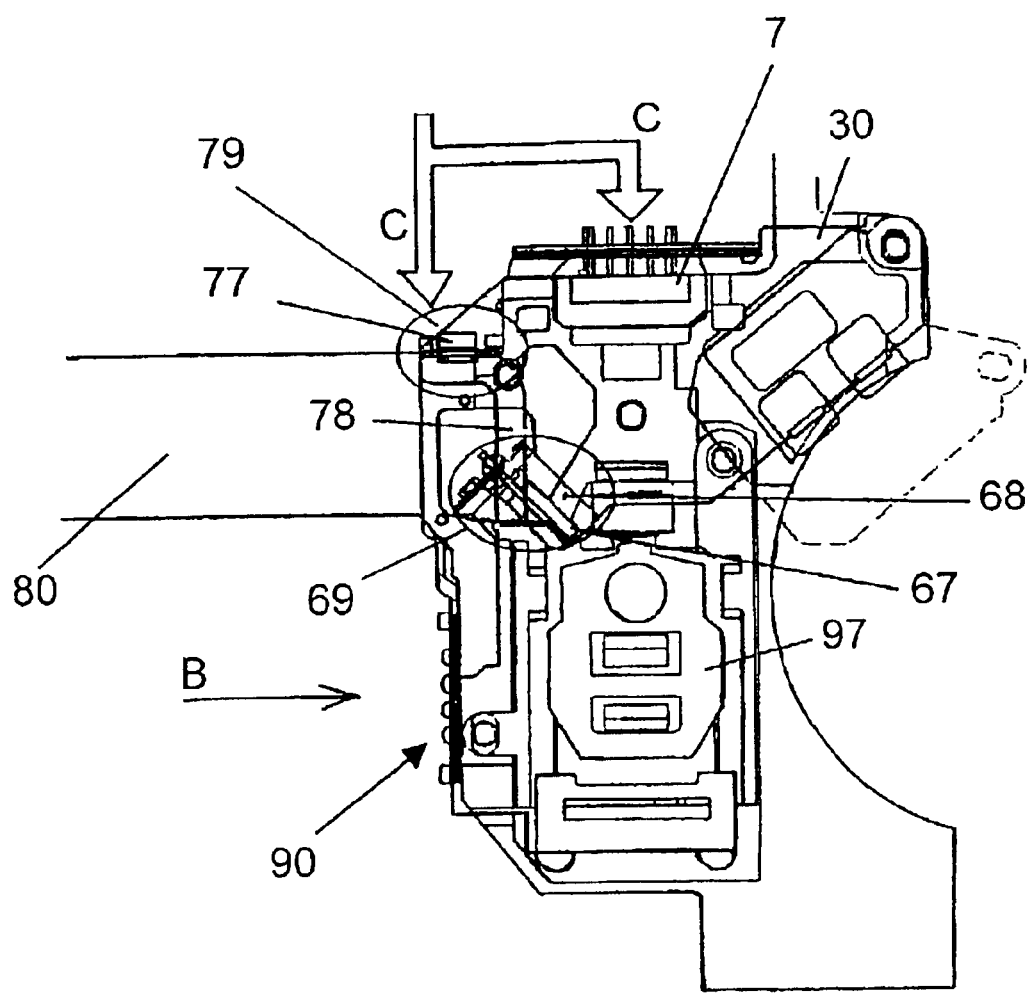
FIG. 5 illustrates a PD mounting position and an adjustment volume mounting position.

FIG. 5 shows the position for attaching a photodetector (PD) 67 different from the photodetector in the hologram unit, and the position of the adjustment volume 77. Mounting of these components onto the FPC is described with reference to FIGS. 3 and 5. PD 67 is mounted on a branch route of PD pattern 68. Volume 77 is mounted on a branch route of volume pattern 78.

Next, attachment of FPC to carriage unit 3 after mounting these components is described. PD mounting position 69 is disposed on carriage unit 3 by creating a space sideways of the light passage between hologram unit 7 and actuator 97. Photodetector 67 is disposed using PD pattern 68 on this PD mounting position 69.

Volume mounting position 79 is disposed on carriage unit 3 at the side of rotation adjustment area 10. Volume 77 is disposed on volume mounting position 79 using volume pattern 78.

In other words, IC mounting land 59 is positioned with reference to grounding 54, and the branch route extended from PD pattern 68 and the branch route extended from volume pattern 78 are attached respectively onto PD mounting position 69 and volume mounting position 79. Volume pattern 78 is assembled on the same face as hologram unit 7 in the same direction but with a front and rear difference. In FIG. 5, hologram unit 7 is disposed to the front of volume 77 when seen from the C direction.

The above configuration allows the aforementioned hologram unit 7 and PD 67 to be adjusted from the same direction (Direction C, indicated by an arrow), realizing both adjustments in the same work step. Moreover, same as for the FPC shielding pattern 50 already described, FPC bending line 47 and bending hole 51 are disposed as close as possible to the mounted components.

In this preferred embodiment, FPC unit 30 is a single layer structure, and a branch route is designed for making wiring pattern within the branch route to the extent that the number of FPC units per sheet does not change. The branch route is then folded for mounting on carriage unit 3. This achieves an FPC with performance equivalent to that of the prior art at less than 50% of the cost of a conventional two-layer FPC.

FIG. 6 is a magnified view of a key part of FIG. 3. Main lead 80, component shielding 81a before cutting, second connecting land 82 on main lead 80, first connecting land 82a on component shielding 81a, cut line 83, and component shielding 81b which is cut and soldered are indicated. The area surrounded by the broken line indicates component mounting land 88 for mounting components other than IC. A shape in which component shielding 81a, whose entire face becomes a grounding pattern, is attached to main lead 80 and manufactured using one mold as main lead 80. Here, the connecting land is formed by soldering a portion where film 23 is removed in advance, as described using FIG. 2, on a predetermined area of component shielding 81a before cutting.

Next, component shielding 81a is cut along cutting line 83. Component shielding 81a is now separated into pieces, and cut component shielding 81a is disposed at a predetermined position of component mounting land 88 on main lead 80. Next, two sheets, which are component shielding 81a and main lead 80, are overlaid, and connecting land 82 and connecting land 82a are soldered. In this preferred embodiment, six connecting lands 82 and six connecting lands 82a are provided. However, the number of connecting lands is not limited to six. The pattern layout and the number of connecting lands can be adjusted to obtain the maximum shielding effect.

As described above, the single-layer main lead 80 of the present invention achieves a high shielding effect, also for component mounting land 88, equivalent to a two-layer FPC. In particular, the present invention achieves an FPC with a shielding effect equivalent to that of the prior art at less than 50% of the cost of a conventional two-layer FPC by employing a single layer FPC unit 30 to which the component shielding is attached to extend the outline (GND pattern) to the extent that the number of FPC units per sheet does not change, and bonding cut component shielding.

Figure 7:
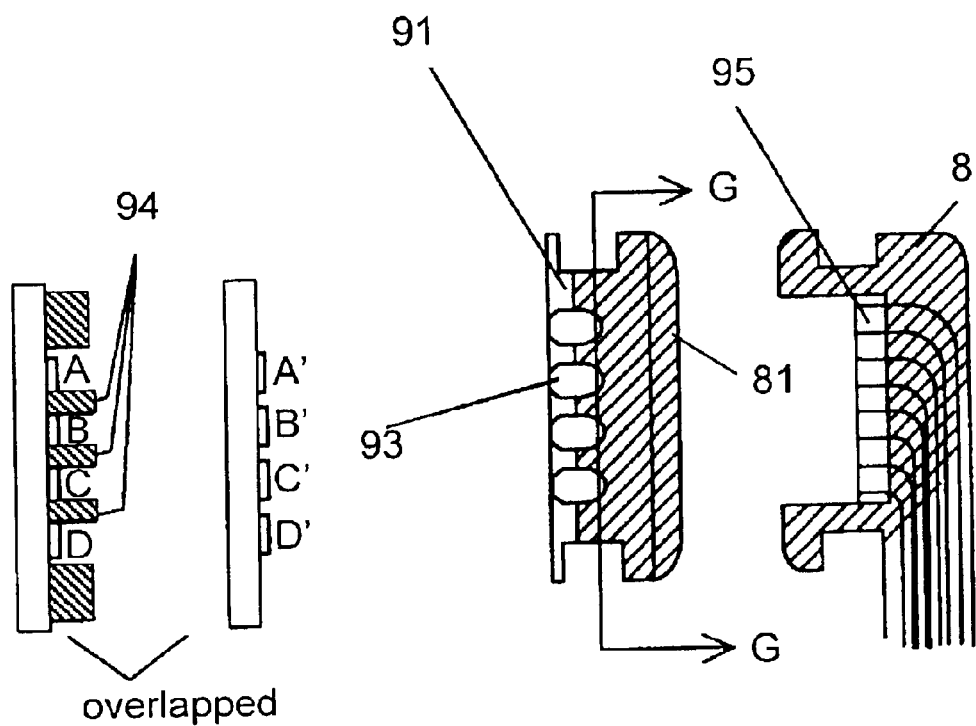
FIG. 7 is a magnified view of a bonded part indicated by Arrow B in FIG. 5.

FIG. 7 is a magnified view of the bonded part indicated by Arrow B in FIG. 5. Cover film cut 91, land 93, and dam 94 on lead 81 are indicated in FIG. 7. Cover film cut 95 is formed on actuator FPC 8. To the left of FIG. 7 is a sectional view of the Figure at the right taken along Line G—G. As described in FIG. 1, lead 81 is bent in Direction E to carriage unit 3, and actuator FPC 8 is bent toward Direction F to carriage unit 3 for attachment.

This makes the concave and convex shapes on lead 81 and actuator FPC 8 fit each other. Accordingly, lands A to D formed on lead 81 and lands A' to D' formed on actuator FPC 8 become connectable. Film cut 91 on lead 81 is provided at the center of land 93 and dam 94 disposed between adjacent lands 93 acts as a dam against melted solder to prevent melted solder from connecting adjacent lands 93. The above configuration achieves the effect of preventing solder short-circuiting between adjacent lands by dam 94 on main lead 80 in soldering actuator FPC 8 and main lead 80.

As described above, the present invention employs a single-layer FPC unit and component shielding. The outline (GND pattern) of the FPC unit is extended to the extent that the number of FPC units per sheet in production does not change. This achieves an FPC unit with a grounding effect and shielding effect equivalent to those of the prior art at 50% or less cost.

Accordingly, the present invention offers an inexpensive pickup device using the FPC unit of the present invention which is inexpensive and has preferable electrical performance. Furthermore, the present invention enables a lower-priced disk drive by employing the inexpensive pickup device of the present invention.

What is claimed is:

1. A flexible printed circuit sheet (FPC) employed in a pickup device for one of recording information onto and reproducing information from an optical medium using a hologram unit having a laser beam source and a photodetector inside, said FPC having:

a single conductive layer whose top and rear faces are insulated by an insulating film; and said FPC comprising:

a main lead for supplying power and transmitting a signal;

a component mounting land for mounting a component, said component mounting land being disposed adjacent to said main lead;

an IC mounting land for mounting an IC, said IC mounting land being disposed adjacent to said component mounting land; and a hologram connecting land for connecting said hologram unit;

wherein said hologram connecting land is formed on the FPC with an opening to branch from said component mounting land, and wherein said opening is an approximate rectangular and surrounded by said hologram connecting land and two bridging portions that bridge to said hologram connecting land, wherein said FPC has an IC shielding adjacent to said IC mounting land, and wherein said IC shielding has said conductive layer on its entire area and a shape that covers an entire area of said IC mounting land when said IC shielding is bent.

2. The FPC as defined in claim 3, wherein said IC shielding has a bending hole for bending at a boundary with said IC mounting land, and a grounding made by partly exposing said conductive layer for grounding.

3. A flexible printed circuit sheet (FPC) employed in a pickup device for one of recording information onto and reproducing information from an optical medium using a hologram unit having a laser beam source and a photodetector inside, said FPC having;

a single conductive layer whose top and rear faces are insulated by an insulating film; and said FPC comprising:

a main lead for supplying power and transmitting a signal;

a component mounting land for mounting a component, said component mounting land being disposed adjacent to said main lead;

an IC mounting land for mounting an IC, said IC mounting land being disposed adjacent to said component mounting land; and a hologram connecting land for connecting said hologram unit;

wherein said hologram connecting land is formed on the FPC with an opening to branch from said component mounting land, and wherein said opening is an approximate rectangular and surrounded by said hologram connecting land and two bridging portions that bridge to said hologram connecting land, wherein said FPC has a component shielding with a predetermined shape which is branched tram a part of said FPC, wherein said component shielding has said conductive layer of said FPC on its entire area and a first connecting land made by partly exposing said conductive layer; and wherein said first connecting land is overlaid on a second connecting land provided on said component mounting land.

4. A pickup device for recording and reproducing, said pickup device comprising:

a carriage movably supported along a radius of an optical medium;

a hologram unit having a laser beam source and an photodetector inside, said hologram unit being disposed in said carriage;

an optical element disposed in said carriage; and a flexible printed circuit sheet (FPC) for supplying power and transmitting a signal;

wherein a face different from a laser beam emitting face of said hologram unit is connected to a hologram connecting land formed at a tip of a branch of said FPC, and said branch of said FPC is bent to a U-shape;

said FPC having;

a single conductive layer whose top and rear faces are insulated by an insulating film; and said FPC comprising;

a main lead disposed on said carriage;

a component mounting land for mounting a component, said component mounting land being disposed adjacent to said main lead;

an IC mounting land for mounting an IC, said IC mounting land being disposed adjacent to said component mounting land; and said hologram connecting land;

wherein said hologram connecting land is disposed perpendicular to said main lead by two branches which includes said branch and a further branch extending from said component mounting land; wherein said two branches each have a U-shape bending portion; and wherein said two branches and said hologram connecting land form an approximately rectangular opening.

wherein said FPC has an IC shielding adjacent to said IC mounting land; and wherein said IC shielding has:

said single conductive layer on its entire area, grounding made by partly exposing said conductive layer for grounding; and a shape that covers an entire area of said IC mounting land.

5. The pickup device as defined in claim 4, wherein said IC shielding has a bending hole for bending at a boundary with said IC mounting land, and said IC shielding is bent onto an opposite face of the FPC against a face on which said IC mounting land is formed.

6. A pickup device for recording and reproducing, said pickup device comprising:

a carriage movably supported along a radius of an optical medium;

a hologram unit having a laser beam source and an photodetector inside, said hologram unit being disposed in said carriage;

an optical element disposed in said carriage; and a flexible printed circuit sheet (FPC) for supplying power and transmitting a signal;

wherein a face different from a laser beam emitting face of said hologram unit is connected to a hologram connecting land formed at a tip of a branch of said FPC, and said branch of said FPC is bent to a U-shape;

said FPC having;

a single conductive layer whose top and rear faces are insulated by an insulating film; and said FPC comprising:

a main lead disposed on said carriage;

a component mounting land for mounting a component, said component mounting land being disposed adjacent to said main lead;

an IC mounting land for mounting an IC, said IC mounting land being disposed adjacent to said component mounting land; and said hologram connecting land;

wherein said hologram connecting land is disposed perpendicular to said main lead by two branches which includes said branch and a further branch extending from said component mounting land; wherein said two branches each have a U-shape bending portion; and wherein said two branches and said hologram connecting land form an approximately rectangular opening, wherein said component mounting land is shielded by overlaying another sheet of FPC, formed in a predetermined shape, onto said component mounting land.

7. A disk drive having a pickup device for one of recording information onto and reproducing information from an optical medium using a hologram unit having a laser beam source and a photodetector inside, said pickup device comprising:

a carriage movably supported along a radius of said optical medium;

an optical element housed in said carriage; and a flexible printed circuit sheet (FPC) for supplying power and transmitting a single, said FPC having;

a single conductive layer whose top and bottom faces are insulated by an insulating film; and said FPC comprising:

a main lead disposed on said carriage;

a component mounting land for mounting a component, said component mounting land being disposed adjacent to said main lead;

an IC mounting land for mounting an IC, said IC mounting land being disposed adjacent to said component mounting land; and a hologram connecting land for connecting said hologram unit;

wherein said hologram connecting land is disposed approximately perpendicular to said main lead by two branches extending from said component mounting land; wherein said two branches have a U-shape bending portion; wherein said two branches and said hologram connecting land form an approximately rectangular opening on said FPC; and wherein a length of said opening in an extending direction of said branches is greater than a height of said hologram unit, wherein said FPC has an IC shielding adjacent to said IC mounting land; and wherein said IC shielding has:

said single conductive layer on its entire area, a grounding made by partly exposing said conductive layer for grounding; and a shape that covers an entire area of said IC mounting land.

8. The disk drive as defined in claim 7, wherein said IC shielding further has a bending hole for bending said IC shielding at a boundary with said IC mounting land; and said IC shielding is bent onto an opposite face of the FPC against a face on which said IC mounting land is formed.

9. A disk drive having a pickup device for one of recording information onto and reproducing information from an optical medium using a hologram unit having a laser beam source and a photodetector inside, said pickup device comprising:

a carriage movably supported along a radius of said optical medium;

an optical element housed in said carriage; and a flexible printed circuit sheet (FPC) for supplying power and transmitting a signal, said FPC having;

a single conductive layer whose top and bottom faces are insulated by an insulating film,; and said FPC comprising:

a main lead disposed on said carriage;

a component mounting land for mounting a component, said component mounting land being disposed adjacent to said main lead;

an IC mounting land for mounting an IC, said IC mounting land being disposed adjacent to said component mounting land; and a hologram connecting land for connecting said hologram unit;

wherein said hologram connecting land is disposed approximately perpendicular to said main lead by two branches extending from said component mounting land; wherein said two branches have a U-shape bending portion; wherein said two branches and said hologram connecting land form an approximately rectangular opening on said FPC; and wherein a length of said opening in an extending direction of said branches is greater than a height of said hologram unit, wherein said FPC further has a component mounting land adjacent to said main lead, and wherein said component mounting land is shielded by overlaying said FPC formed in a predetermined shape.

10. A disk drive having a pickup device for one of recording information onto and reproducing information from an optical medium using a hologram unit having a laser beam source and a photodetector inside, said pickup device comprising:

a carriage movably supported along a radius of said optical medium;

an optical element housed in said carriage; and a flexible printed circuit sheet (FPC) for supplying power and transmitting a signal, said FPC having;

a single conductive layer whose top and bottom faces are insulated by an insulating film,; and said FPC comprising:

a main lead disposed on said carriage;

a component mounting land for mounting a component, said component mounting land being disposed adjacent to said main lead;

an IC mounting land for mounting an IC, said IC mounting land being disposed adjacent to said component mounting land; and a hologram connecting land for connecting said hologram unit;

wherein said hologram connecting land is disposed approximately perpendicular to said main lead by two branches extending from said component mounting land; wherein said two branches have a U-shape bending portion; wherein said two branches and said hologram connecting land form an approximately rectangular opening on said FPC; and wherein a length of said opening in an extending direction of said branches is greater than a height of said hologram unit, wherein said carriage has a projection for positioning, and said FPC has a positioning hole which fits with said projection; and said projection and said positioning hole are fitted at a position where said main lead is drawn out from said carriage for retaining said main lead.

* * * * *